United States Patent
Chandrasekaran et al.

(10) Patent No.: US 10,149,031 B2
(45) Date of Patent: Dec. 4, 2018

(54) MICROPHONE DEVICE WITH INTEGRATED PRESSURE SENSOR

(71) Applicant: Knowles Electronics, LLC, Itasca, IL (US)

(72) Inventors: Venkataraman Chandrasekaran, Itasca, IL (US); Claus Furst, Roskilde (DK); Joshua Watson, Aurora, IL (US); John Szczech, Schaumburg, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 15/604,414

(22) Filed: May 24, 2017

(65) Prior Publication Data

US 2017/0347174 A1    Nov. 30, 2017

Related U.S. Application Data

(60) Provisional application No. 62/341,695, filed on May 26, 2016.

(51) Int. Cl.
| | |
|---|---|
| *H04R 3/00* | (2006.01) |
| *H04R 1/02* | (2006.01) |
| *B81B 7/02* | (2006.01) |
| *H04R 1/04* | (2006.01) |
| *H04R 19/00* | (2006.01) |
| *H04R 19/04* | (2006.01) |
| *B81B 7/00* | (2006.01) |

(Continued)

(52) U.S. Cl.
CPC ............... *H04R 1/028* (2013.01); *B81B 7/02* (2013.01); *H04R 1/04* (2013.01); *H04R 3/005* (2013.01);

(Continued)

(58) Field of Classification Search
CPC ........ H04R 1/028; H04R 1/04; H04R 19/005; H04R 19/04; H04R 2201/003; H04R 3/005; H04R 2430/21; B81B 7/02; B81B 2201/0264; B81B 2201/0257; B81B 7/0061; B81B 2201/012; B81C 1/00238;
(Continued)

(56) References Cited

U.S. PATENT DOCUMENTS

| | | |
|---|---|---|
| 7,190,038 B2 | 3/2007 | Dehe et al. |
| 7,473,572 B2 | 1/2009 | Dehe et al. |

(Continued)

OTHER PUBLICATIONS

International Search Report and Written Opinion, PCT/US2017/034317, Knowles Electronics, LLC, 10 pages. (dated Jul. 27, 2017).

*Primary Examiner* — Andrew L Sniezek
(74) *Attorney, Agent, or Firm* — Foley & Lardner LLP

(57) ABSTRACT

A microphone device comprises a microphone die including a first microphone motor and a second microphone motor, an acoustic integrated circuit structured to process signals produced by the first microphone motor and the second microphone motor, and a sensor die stacked on top of the acoustic integrated circuit, wherein the sensor die comprises a pressure sensor. Another microphone comprises a microphone die including a first microphone motor and a second microphone motor and an integrated circuit die. The integrated circuit die comprises an acoustic integrated circuit structured to process signals produced by the first microphone motor and the second microphone motor, a pressure sensor, and a pressure integrated circuit structured to press signals produced by the pressure sensor.

16 Claims, 10 Drawing Sheets

(51) Int. Cl.
*B81C 1/00* (2006.01)
*G01L 23/12* (2006.01)
*G01L 27/00* (2006.01)

(52) U.S. Cl.
CPC ............ *H04R 19/005* (2013.01); *H04R 19/04* (2013.01); *B81B 7/0061* (2013.01); *B81B 2201/012* (2013.01); *B81B 2201/0257* (2013.01); *B81B 2201/0264* (2013.01); *B81C 1/00238* (2013.01); *G01L 23/125* (2013.01); *G01L 27/005* (2013.01); *H01L 2224/48091* (2013.01); *H01L 2924/15151* (2013.01); *H01L 2924/16152* (2013.01); *H04R 2201/003* (2013.01); *H04R 2430/21* (2013.01)

(58) Field of Classification Search
CPC ................ G10L 23/125; G10L 27/005; H01L 2224/48091; H01L 2924/15151; H01L 2924/16152; H01L 2924/00014
See application file for complete search history.

(56) References Cited

U.S. PATENT DOCUMENTS

| | | | |
|---|---|---|---|
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 2005/0207605 A1 | 9/2005 | Dehe et al. | |
| 2007/0278501 A1 | 12/2007 | MacPherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 3/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2012/0087521 A1 | 4/2012 | Delaus et al. | |
| 2014/0060146 A1* | 3/2014 | Zoellin | G01L 27/005 73/1.15 |
| 2014/0307885 A1 | 10/2014 | Schultz et al. | |
| 2015/0158722 A1 | 6/2015 | Lim et al. | |

* cited by examiner

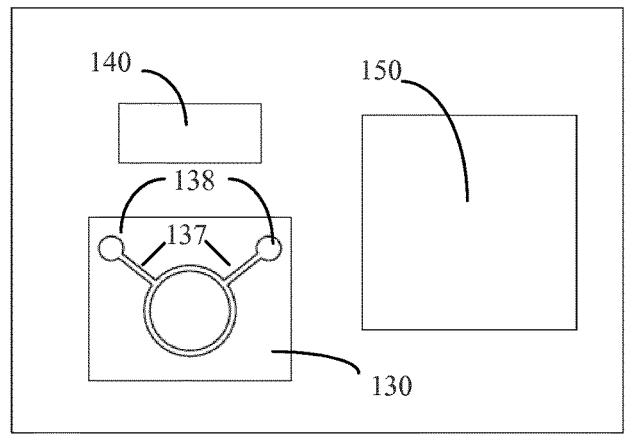
FIG. 1(B)
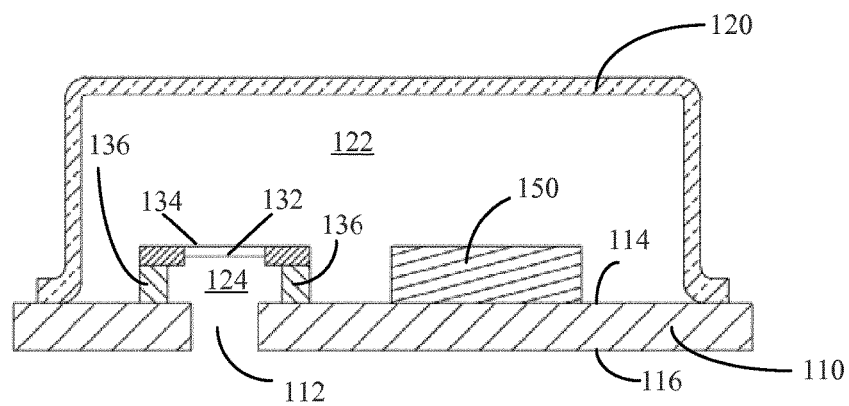
FIG. 1(C)
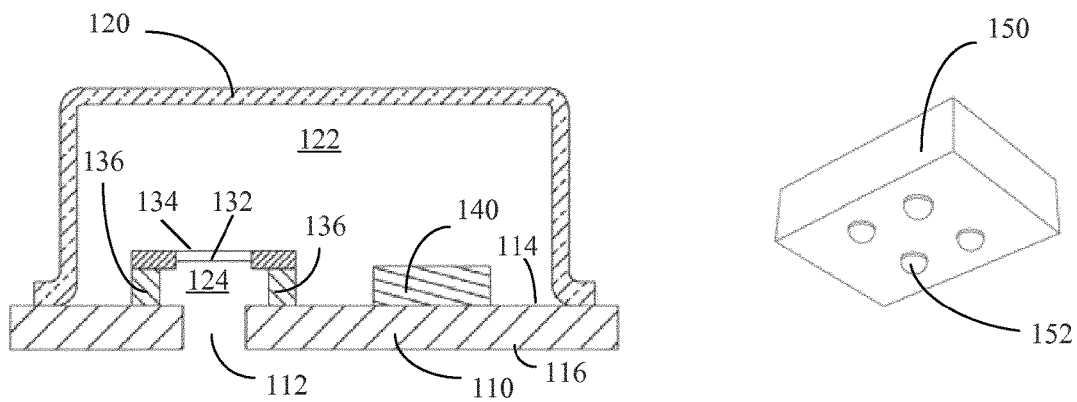
FIG. 1(D)
FIG. 1(E)

MICROPHONE DEVICE WITH INTEGRATED PRESSURE SENSOR

CROSS-REFERENCE TO RELATED APPLICATIONS

The present application claims priority to and the benefit of U.S. Provisional Application No. 62/341,695 "MICROPHONE DEVICE WITH INTEGRATED PRESSURE SENSOR" filed May 26, 2016, the contents of which are incorporated by reference herein in their entirety.

FIELD

The present disclosure relates generally to microphone devices, and more specifically, to a microphone device integrating a pressure sensor with microelectro-mechanical systems (MEMS) microphone(s).

BACKGROUND

Microphones are used in various electronic devices, such as smartphones, portable computers, tablets, hearing aids, etc. In some situations, it is desirable to provide pressure sensors to electronic devices for sensing the atmospheric pressure in the vicinity. For example, the pressure sensor can be used as an altimeter to aid altitude measurement by the GPS on a smartphone. In another application, the pressure sensor can be used as a barometer to detect change in the air pressure in order to obtain climate information. However, when placed within the device (e.g., a smartphone), the pressure sensor might lose accuracy due to the design of the device, which substantially isolates components inside the device from ambient conditions. In addition, the pressure sensor is sensitive to case deformation and internal heat sources (e.g., application processors) of the device, which further worsens the accuracy of the pressure sensor.

SUMMARY

One embodiment of the disclosure relates to a microphone device comprising a substrate, a port formed in the substrate, and a cover attached to the substrate that forms a housing interior with the substrate. A microphone die is disposed in the housing interior and on top of the port. The microphone die includes a diaphragm and a backplate opposing the diaphragm. In some embodiments, the microphone die can include dual backplates. A wafer level chip scale package is disposed in the housing interior and attached to the substrate. The wafer level chip scale package includes a pressure sensor.

In some embodiments, the microphone device further comprises an acoustic integrated circuit disposed in the housing interior and attached to the substrate, wherein the acoustic integrated circuit is structured to process signals produced by the microphone die. In some embodiments, the microphone device further comprises an acoustic integrated circuit embedded in the substrate, wherein the acoustic integrated circuit is structured to process signals produced by the microphone die. In some embodiments, the microphone die is disposed at least partially over the acoustic integrated circuit. In some embodiments, the wafer level chip scale package is attached to the substrate through solder balls on a surface of the wafer level chip scale package in a flip chip configuration. In some embodiments, the wafer level chip scale package further comprises a pressure integrate circuit structured to process signals produced by the pressure sensor. In some embodiments, the wafer level chip scale package further comprises a temperature sensor. In some embodiments, the pressure sensor carried by the wafer level chip scale package is pre-calibrated before the wafer level chip scale package is integrated into the microphone device.

Another embodiment of the disclosure relates to a microphone device comprising a substrate, a port formed in the substrate, and a cover attached to the substrate that forms a housing interior with the substrate. A microphone die is disposed in the housing interior and on top of the port. The microphone die includes a first microphone motor and a second microphone motor. The first microphone motor includes a first diaphragm and a first backplate opposing the first diaphragm. The second microphone motor includes a second diaphragm and a second backplate opposing the second diaphragm. An acoustic integrated circuit is structured to process signals produced by the first microphone motor and the second microphone motor. A sensor die is disposed in the housing interior and stacked on top of the acoustic integrated circuit.

In some embodiments, the acoustic integrated circuit is disposed in the housing interior and attached to the substrate. In some embodiments, a back surface of the sensor die is attached to the acoustic integrated circuit through a low-pressure adhesive. In some embodiments, the acoustic integrated circuit is embedded in the substrate. In some embodiments, the microphone die is disposed at least partially over the acoustic integrated circuit. In some embodiments, the second microphone motor is disposed alongside the first microphone motor, and the first microphone motor and the second microphone motor are in a differential output configuration. In some embodiments, voltages of opposite polarities are applied to the first diaphragm and the second diaphragm. In some embodiments, the second diaphragm and the second backplate are flipped comparing to the first diaphragm and the first backplate. In some embodiments, the acoustic integrated circuit is an application specific integrated circuit (ASIC) die. In some embodiments, the first microphone motor and the second microphone motor are microelectro mechanical system (MEMS) microphones, and wherein the pressure sensor is a MEMS pressure sensor. In some embodiments, the sensor die further comprises a temperature sensor. In some embodiments, the pressure sensor carried by the sensor die is calibrated after the sensor die is integrated into the microphone device. In some embodiments, calibration information of the pressure sensor is stored in a one-time programmable memory included in the sensor die.

Still another embodiment of the disclosure relates to a microphone device comprising a substrate, a port formed in the substrate, and a cover attached to the substrate that forms a housing interior with the substrate. A microphone die is disposed in the housing interior and on top of the port. The microphone die includes a first microphone motor and a second microphone motor. The first microphone motor includes a first diaphragm and a first backplate opposing the first diaphragm. The second microphone motor includes a second diaphragm and a second backplate opposing the second diaphragm. An integrated circuit die is disposed in the housing interior and attached to the substrate. The integrated circuit die comprises an acoustic integrated circuit structured to process signals produced by the first microphone motor and the second microphone motor, a pressure sensor, and a pressure integrated circuit structured to process signals produced by the pressure sensor.

In some embodiments, the second microphone motor is disposed alongside the first microphone motor, and the first microphone motor and the second microphone motor are in a differential output configuration. In some embodiments, voltages of opposite polarities are applied to the first diaphragm and the second diaphragm. In some embodiments, the second diaphragm and the second backplate are flipped comparing to the first diaphragm and the first backplate. In some embodiments, the integrated die further comprises a temperature sensor. In some embodiments, the pressure sensor carried by the integrated circuit die is calibrated after the integrated circuit die is integrated into the microphone device. In some embodiments, calibration information of the pressure sensor is stored in a one-time programmable memory included in the integrated circuit die.

Another embodiment of the disclosure relates to a microphone device comprising a substrate, a cover, a port formed in the cover, and a wall attached to the substrate and the cover that forms a housing interior with the substrate and the cover. A microphone die is attached to the cover and disposed in the housing interior. The microphone die includes a diaphragm and a backplate opposing the diaphragm. A sensor die is disposed in the housing interior and attached to the substrate. The sensor die comprises a pressure sensor.

In some embodiments, the microphone device further comprises an acoustic integrated circuit disposed in the housing interior and attached to the cover, wherein the acoustic integrated circuit is structured to process signals produced by the microphone die. In some embodiments, the microphone device further comprises an acoustic integrated circuit embedded in the cover, wherein the acoustic integrated circuit is structured to process signals produced by the microphone die. In some embodiments, the sensor die further comprises a temperature sensor. In some embodiments, the pressure sensor is calibrated after the sensor die is integrated into the microphone device. In some embodiments, calibration information of the pressure sensor is stored in a one-time programmable memory included in the sensor die.

These and other features, together with the organization and manner of operation thereof, will become apparent from the following detailed description when taken in conjunction with the accompanying drawings.

BRIEF DESCRIPTION OF THE DRAWINGS

FIG. 1(B) is a top plan diagram of the microphone device of FIG. 1(A);

FIG. 1(C) is a cross-sectional diagram of the microphone device of FIG. 1(A), along the line A-A';

FIG. 1(D) is a cross-sectional diagram of the microphone device of FIG. 1(A), along the line B-B';

FIG. 1(E) is a schematic prospective diagram a wafer level chip scale package (WLCSP) that includes a pressure sensor to be integrated into the microphone device of FIGS. 1(A) through 1(D);

In the following detailed description, reference is made to the accompanying drawings, which form a part hereof. In the drawings, similar symbols typically identify similar components, unless context dictates otherwise.

DETAILED DESCRIPTION

Referring to the figures generally, various embodiments disclosed herein relate to microphone devices with integrated pressure sensors, i.e., one or more microphones packaged with a pressure sensor in a single package. In particular, the pressure sensor is placed in the back volume of a microphone and relies on the leak through and around the microphone for the atmospheric pressure measurement. With careful layouts of the components illustrated herein, the acoustic performance can be optimized, the pressure measurement accuracy can be improved, the footprint can be reduced, and the manufacturing process can be simplified at the same time. The accuracy of the pressure measurement can improve when the pressure sensor is packaged with the microphone, which is often disposed behind an open port of the device. The open port allows sound and air flow to pass through and makes the pressure sensor proximate to the ambient environment. Furthermore, integrating the pressure sensor with the microphone in a single package can reduce the footprint, which is generally desired for electronic devices.

Figure 1A:
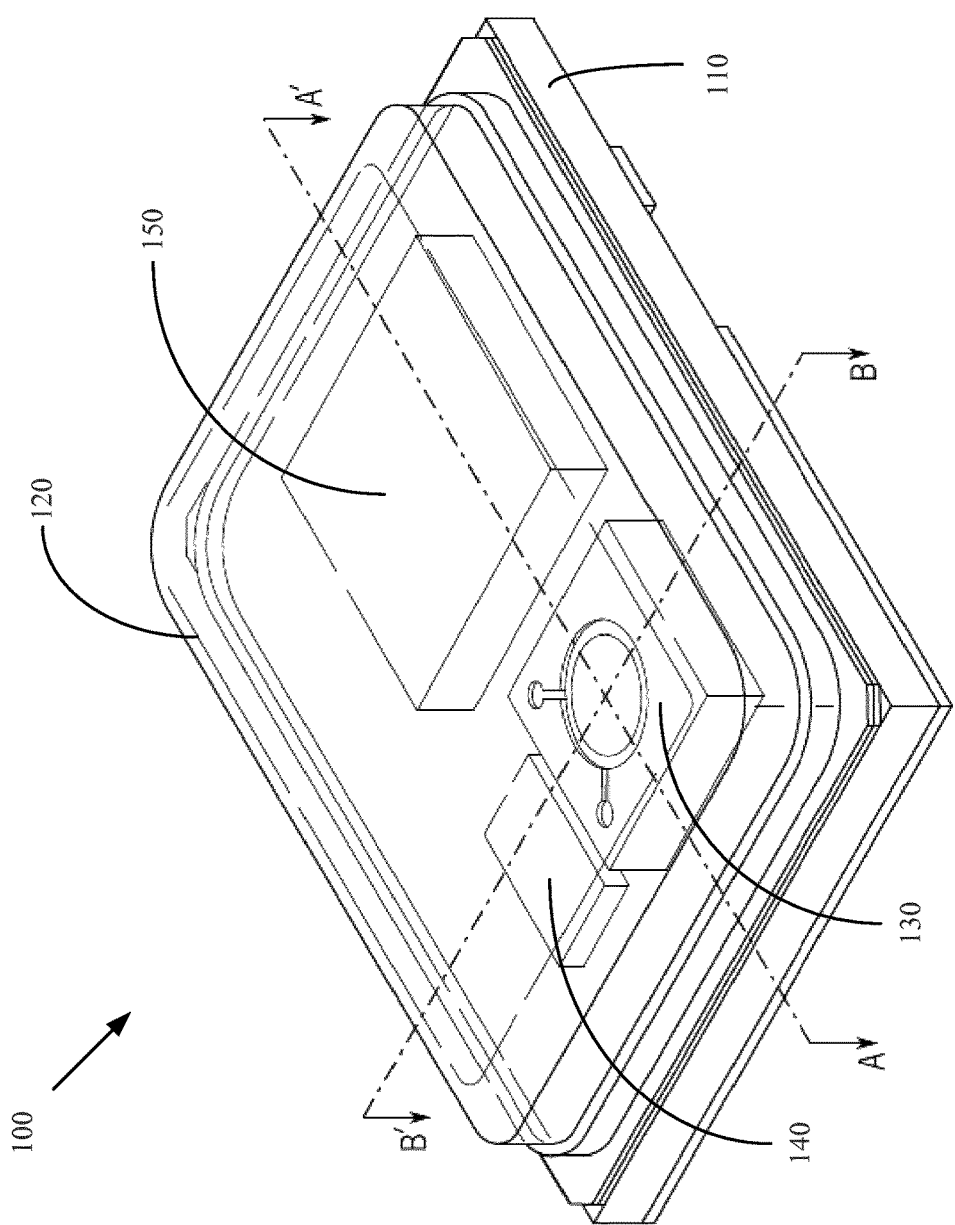
FIG. 1(A) is a schematic perspective diagram of a microphone device with an integrated pressure sensor according to a first embodiment.

Referring to FIGS. 1(A) through 1(E), a microphone device with an integrated pressure sensor is shown according to a first embodiment. FIG. 1(A) shows the schematic perspective diagram of the microphone device; FIG. 1(B) shows the top plan diagram of the microphone device; FIG. 1(C) shows a cross-sectional diagram of the microphone device along the line A-A'; FIG. 1(D) shows a cross-sectional diagram of the microphone device along the line B-B'; and FIG. 1(E) shows a schematic prospective diagram of a wafer level chip scale package (WLCSP) that includes a pressure sensor, to be integrated into the microphone device. The microphone device 100 includes a substrate (or base) 110, a cover (or lid) 120, a microphone die 130, an integrated circuit 140, and a pressure sensor provided in a WLCSP 150. The cover 120 is attached to the substrate 110 and forms a housing interior 122 with the substrate 110. A port 112 is formed in the substrate 110, allowing sound and air flow to enter the housing interior 122. The microphone die 130, the integrated circuit 140, and the WLCSP 150 carrying the pressure sensor are all disposed within the housing interior 122 and attached to the substrate 110.

The substrate 110 may be a printed circuit board (PCB) formed of, for example, a solder mask layer, a metal layer, and an inner PCB layer (e.g., constructed of FR-4 material). In some embodiments, the substrate 110 includes alternating layers of conductive material (e.g., copper) and non-conductive materials (e.g., FR-4 material). The substrate 110 provides electrical paths connecting the components inside the housing interior 122 to components/devices outside of the housing. In particular, an inner surface 114 of the substrate 110 may include etched portions of conductive material to define lead pads, bond pads, ground pads, etc. (not shown in the present figures) that can be electrically connected to the microphone die 130, the integrated circuit 140, and the WLCSP 150 through wire bonding, flip chip bonding, and so on. These conductive pads are electrically connected to conductive vias (not shown in the present figures) extending through the substrate 110. The vias are holes drilled through the substrates 110 and filled or plated with a conductive material. The vias are electrically connected to connection areas (not shown in the present figures) formed on an outer surface 116 of the substrate 110. The connections areas may be customer pads for electrical connection to an external board of an end-user device. For example, if the microphone device 100 is deployed in a smartphone, the connection areas are electrically coupled to a motherboard of the smartphone. It shall be understood that various fabrication approaches can be used to construct the substrate 110 and various electrical paths can be formed in the substrate 110.

The port 112 is formed in the substrate 110 for receiving acoustic waves and air flow. The port 112 can be in the shape of circle, oval, rectangle, etc. In some embodiments, a mesh covers the port 112 for preventing water, particles, and/or light from entering the housing interior 122.

The cover 120 may be a one-piece cup-shaped can made of pre-molded metal or plastic. In other embodiments, the cover 120 includes a wall and a flat top over the wall. In some embodiments, the cover 120 includes multiple layers, such as one or more plastic, ceramic, and/or metal layers. The cover 120 may have an internal metal coating that provides an electromagnetic shield (i.e., Faraday cage), preventing disturbance by external electromagnetic signals. The cover 120 is attached to the substrate 110 and forms the housing interior 122 with the substrate 110. In particular, a peripheral edge of the cover 120 may be fastened to the substrate 110 by adhesive, solder, and so on, thus forming a hermetical and acoustic seal.

The microphone die 130 is attached to the inner surface 114 of the substrate 110 and disposed on top of the port 112. As used herein, a die refers to a small block of semiconducting material, on which one or more functional circuits are fabricated. The microphone die 130 may be a micro-electro-mechanical systems (MEMS) microphone, including a diaphragm 132, a backplate 134 opposing the diaphragm 132, and a supporting structure 136 supporting the diaphragm 132 and the backplate 134. In some embodiments, the microphone die 130 can include more than one backplate. For example, the microphone die 130 can include dual backplates. In some embodiments, the diaphragm 132 is located between the backplates. In other embodiments, the backplate 134 can be split into two or more backplates.

The supporting structure 136 is formed of a semiconductor material (e.g., silicon) and attached to the inner surface 114 of the substrate 110 by, for example, adhesive. In some embodiments, the diaphragm 132 is a "free plate" diaphragm not secured to the supporting structure 136. The diaphragm 132 is free to move within the space where it is disposed. In other embodiments, movement of the diaphragm 132 is constrained by some constraining elements provided around the periphery of the diaphragm 132. In yet other embodiments, the diaphragm 132 is anchored at the periphery or certain regions of the periphery to the supporting structure 136 and the central portion can move or bend in response to pressure exerted by acoustic waves (i.e., sound). The backplate 134 is rigid and held by the supporting structure 136. The diaphragm 132 and the backplate 134 include conductive material and collectively form a capacitor. The capacitance varies as the distance between the diaphragm 132 and the backplate 134 changes due to the movement of the diaphragm 132 caused by acoustic waves, thus producing electrical signals (e.g., voltage, current) that can be sensed.

In operation, sound enters a front volume 124 formed by the supporting structure 136 and the diaphragm 132 through the port 112. The acoustic waves move the diaphragm 132 and electrical signals are produced reflecting the capacitance change between the diaphragm 132 and the backplate 134. The available space in the housing interior 122 forms the back volume for the microphone. On the other hand, air flow can leak through (and around) the diaphragm 132 and the backplate 134 and reach the pressure sensor carried by the WLCSP 150 inside the housing interior 122. Through hole(s) are made on the diaphragm 132 to enable equalization of the static pressure on both sides of the diaphragm 132. In some embodiments, a plurality of perforations are formed on the backplate 134 to enable ventilation or free circulation of air between the backplate 134 and the diaphragm 132. In further embodiments, there is empty space between the diaphragm 132 and the supporting structure 136 and/or in the supporting structure 136 for air to circulate between the front volume 124 and the housing interior 122. In other words, since the microphone components are permeable to pressure changes below certain frequency, the static or slowly varying atmospheric pressure can pass the microphone components and apply to the pressure sensor inside the housing interior 122. In some embodiments, the working frequency of the microphone is around 20 Hz to 20 KHz, therefore, atmospheric pressure changes with frequencies less than the cutoff frequency 20 Hz can pass the microphone. In other embodiments, the diaphragm 132 is not pierced such that the diaphragm 132 does not include any through holes.

The microphone die 130 further includes electrical connections for connecting the microphone die 130 to a source and/or a ground and the integrated circuit 140 for transmitting electrical signals produced. For the microphone die 130 shown in FIG. 1(B), the electrical connections include conductive traces 137 and bond pads 138. It shall be understood that this is for illustration and not for limiting; other types of electrical connections can be implemented on the microphone die 130.

The integrated circuit 140 is attached to the inner surface 114 of the substrate 110 and disposed alongside the microphone die 130 along the direction B-B'. The integrated circuit 140 may be an application specification integrated circuit (ASIC) fabricated on a die and attached to the inner surface 114 of the substrate 110 by, for example, adhesive. The integrated circuit 140 is configured to carry out operations such as amplification, filtering, processing, etc., to the electrical signals produced by the microphone die 130 and generate an output that can be used by, for example, an end-user device. The processing operations by the integrated circuit 140 can include analog and/or digital signal processing functions. In some embodiments, the electrical signals produced by the microphone die 130 are transmitted to the integrated circuit 140 through wire bonding between the bond pads 138 on the microphone die 130 and corresponding pads (not shown in the present figures) on the integrated circuit 140. The output of the integrated circuit 140 can be transmitted through wire bonding between the integrated circuit 140 and the conductive pads on the inner surface 114 of the substrate 110, then through the conductive vias extending through the substrate 110 and the connections areas on the outer surface 116 of the substrate 110, to the external device, as discussed above regarding electrical connections of the substrate 110. It shall be understood that this is for illustration and not for limiting; various approaches can be used to make electrical connections between the integrated circuit 140 and the external device for outputting the processed signals.

The WLCSP 150 carrying the pressure sensor is attached to the inner surface 114 of the substrate 110 and disposed alongside the microphone die 130 along the direction A-A'. In some embodiments, the direction A-A' is different from the direction B-B'. In further embodiments, the direction A-A' is substantially perpendicular to the direction B-B'. As used herein, a WLCSP refers to the technology of packaging an integrated circuit at the wafer level instead of assembling individual units in packages after dicing them from a wafer. As shown in FIG. 1(E), the WLCSP 150 may be a die with an array of solder balls (also referred to as "bumps") 152 on a surface. The WLCSP 150 can be fastened and electrically connected to the inner surface 114 of the substrate 110 through the solder balls 152 by a soldering process, in a flip chip configuration. As used herein, a flip chip configuration means that the WLCSP 150 is bonded directly to the substrate 110 through the solder balls 152. In some embodiments, the WLCSP 150 further includes protection layers protecting internal circuits from the environment. The WLCSP 150 is a package that has the same footprint as or slightly larger footprint than the enclosed die. Other advantages of the WLCSP include minimized die-to-PCB inductance, enhanced thermal conduction, etc.

The pressure sensor carried by the WLCSP 150 can sense the atmospheric pressure in the vicinity of the device 100. In one application, the pressure sensor can be used as an altimeter to aid in correcting altitude measurement by the GPS on, for example, a smartphone or an outdoor watch. In another application, the pressure sensor can be used as a barometer to obtain climate information by detecting change in the atmospheric pressure due to an approaching thunderstorm, cold front, hurricane, and so on. In some embodiments, the pressure sensor includes a piezo-resistive transducer for which the resistance varies with the change of the air pressure. The pressure sensor may be a MEMS pressure sensor. It shall be understood that this is for illustration not for limiting; the pressure sensor may use other operations, such as capacitance variation, inductance variation, or mass loading, to turn the atmospheric pressure information to electrical signals that can be sensed.

The air flow can reach the pressure sensor inside the housing interior 122, thus enabling the sensing operation. In particular, the air flow coming from the exterior environment passes through the port 112 and the front volume 124, leaks through (and around) the diaphragm 132 and the backplate 134, and reaches the pressure sensor carried by the WLCSP 150 inside the housing interior 122. As discussed above regarding the microphone, the static or slowly varying atmospheric pressure can pass the microphone components since the microphone components are permeable to pressure changes below the cutoff frequency (e.g., 20 Hz). In other words, the port 112 defines both the acoustic access port for the microphone and the access port for the pressure sensor.

The WLCSP 150 may further include an integrated circuit for driving the pressure sensor and/or processing electrical signals produced by the pressure sensor. The integrated circuit carries out operations such as amplification, filtering, processing, etc., to the signals produced by the pressure sensor and generates an output that can be used by, for example, an end-user device. The processing operations by the integrated circuit can include analog and/or digital signal processing functions. The output of the integrated circuit can be transmitted through the solder balls 152 to the conductive pads on the inner surface 114 of the substrate 110, then through the conductive vias extending through the substrate 110 and the connections areas on the outer surface 116 of the substrate 110, to the external device, as discussed above regarding electrical connections of the substrate 110. In some embodiments, the pressure sensor carried by the WLCSP 150 is calibrated before the WLCSP 150 is integrated into the microphone device 100 in order to deliver an accurate reading. During calibration, the readouts of the pressure sensor are compared to the accurate values, and the relationship between the measured and the accurate value is determined. In further embodiments, the calibration information is stored in a memory, for example, a one time programmable memory (OTP). The memory storing the calibration information can be included in the WLCSP 150.

In some embodiments, the WLCSP 150 further includes a temperature sensor and an integrated circuit for driving the temperature sensor and/or processing electrical signals produced by the temperature sensor. The temperature sensor can be used for ambient temperature measurements. In addition, since temperature often affects the operation of the pressure sensor to some extent, the temperature readings can be used to correct the pressure readings. In some embodiments, the temperature sensor is a resistive temperature device made from a material with a known temperature coefficient. The temperature sensor may use other operations, such as capacitance variation, thermocouple, to turn the temperature information to electrical signals that can be sensed.

For the microphone device with the integrated pressure sensor as show in FIGS. 1(A) through 1(E), the acoustic performance can be optimized, the pressure measurement accuracy can be improved, the footprint can be reduced, and the manufacturing process can be simplified. Since nearly the entire housing interior 122 is used as the back volume for the microphone, the microphone sensitivity is increased and the signal-to-noise ratio (SNR) is improved. The improvement of pressure measurement is due to the fluid communication of the pressure sensor with the ambience through the acoustic port of the microphone. Further, by integrating the pressure sensor provided in the WLCSP with the microphone die in a single package, the footprint can be reduced and the manufacturing process can be simplified.

Figure 1F:
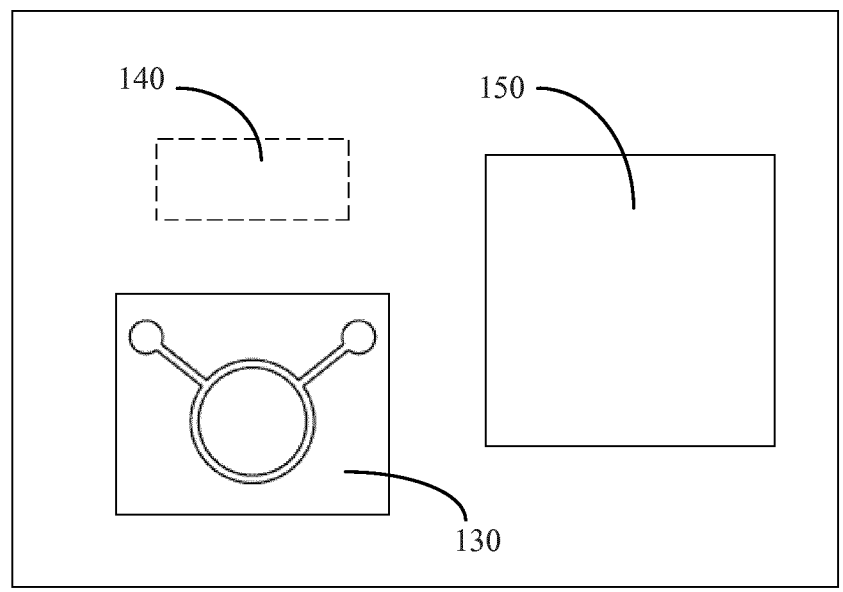
FIG. 1(F) is a top plan diagram of a variation of the microphone device of FIG. 1(A)
Figure 1G:
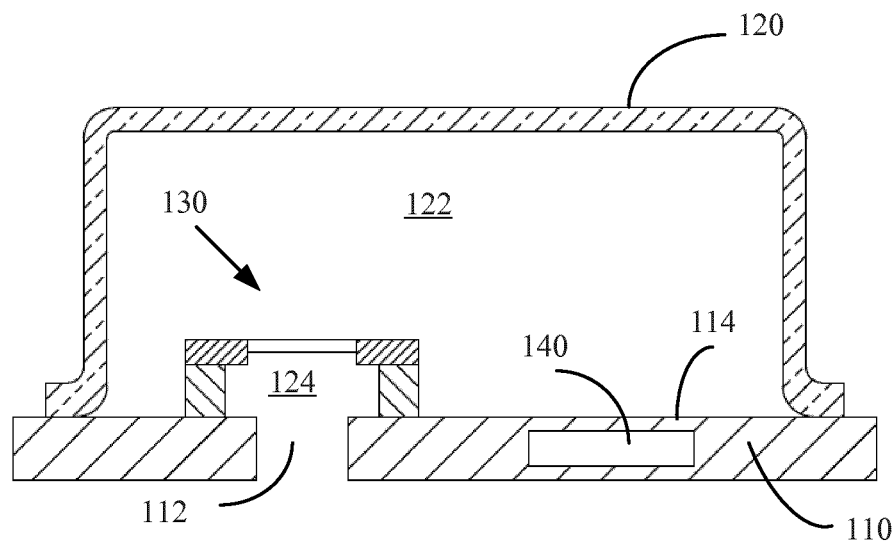
FIG. 1(G) is a cross-sectional diagram of the microphone device of FIG. 1(F)

Referring to FIGS. 1(F) and 1(G), a variation of the microphone device depicted in FIGS. 1(A) through 1(E) is shown. FIG. 1(F) shows the top plan diagram of the variation; and FIG. 1(G) shows the cross-sectional diagram along the line B-B'. The microphone device with an integrated pressure sensor as shown in FIGS. 1(F) and 1(G) is similar to the device shown in FIGS. 1(A) through 1(E) except that the integrated circuit 140 is embedded in the substrate 110. As used herein, being embedded in the substrate 110 means that the integrated circuit 140 is completely surrounded by the substrate 110. In some embodiments, the integrated circuit 140 is embedded into the substrate 110 by the process of laminating, i.e., the PCB materials (epoxy laminate, copper, and adhesive) are layered and placed around the integrated circuit 140 in a process using temperature, pressure and potentially in a vacuum environment. In further embodiments, through hole vias filled or plated with a conductive material are formed in the substrate 110 extending from the integrated circuit 140 to the conductive pads on the inner surface 114 of the substrate 110, which are also referred to as "µ-vias." The µ-vias electrically connects the integrated circuit 140 to the conductive pads for receiving the electrical signals produced by the microphone die 130 and transmitting the processed signal to the external device. Back volume can increase due to the arrangement of embedded integrated circuit, thus improving the acoustic performance (e.g., SNR) of the microphone device 100. Furthermore, larger dies can be accommodated for a given package size due to the increased back volume.

Figure 1H:
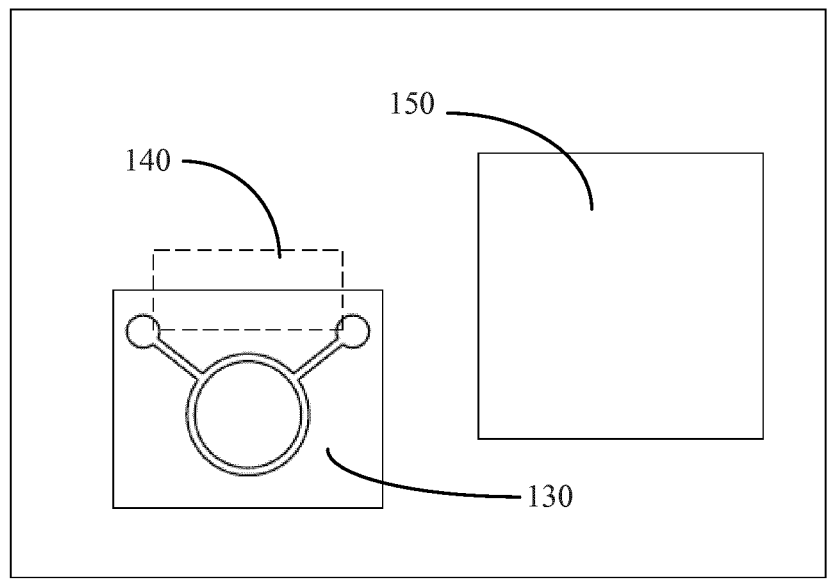
FIG. 1(H) is a top plan diagram of another variation of the microphone device of FIG. 1(A)
Figure 1I:
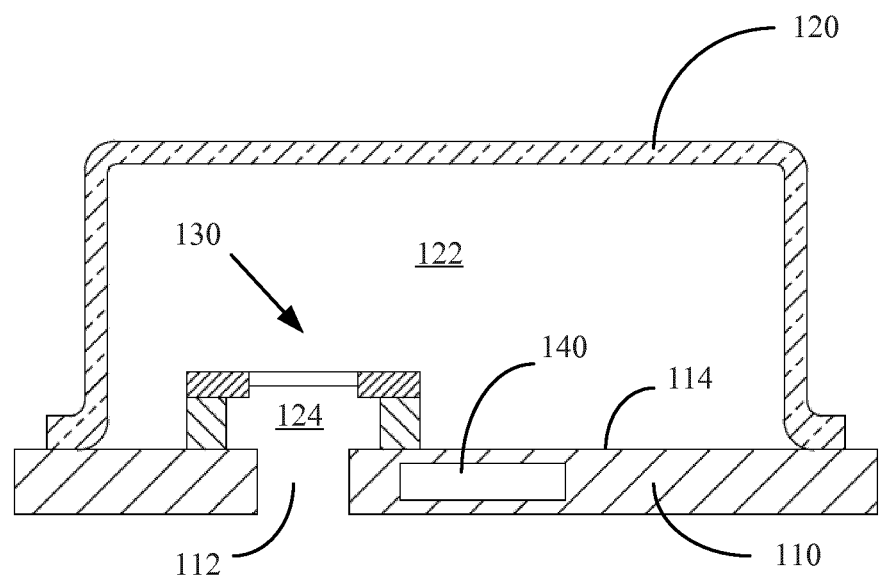
FIG. 1(I) is a cross-sectional diagram of the microphone device of FIG. 1(H).

Referring to FIGS. 1(H) and 1(I), another variation of the microphone device depicted in FIGS. 1(A) through 1(E) is shown. FIG. 1(H) shows the top plan diagram of the variation; and FIG. 1(I) shows the cross-sectional diagram along the line B-B'. Like the microphone device shown in FIGS. 1(F) and 1(G), the integrated circuit 140 is embedded in the substrate 110. But the microphone die 130 is disposed at least partially over the integrated circuit 140. This arrangement of overlapping microphone die 130 and integrated circuit 140 can further reduce the size of the overall device.

Figure 2A:
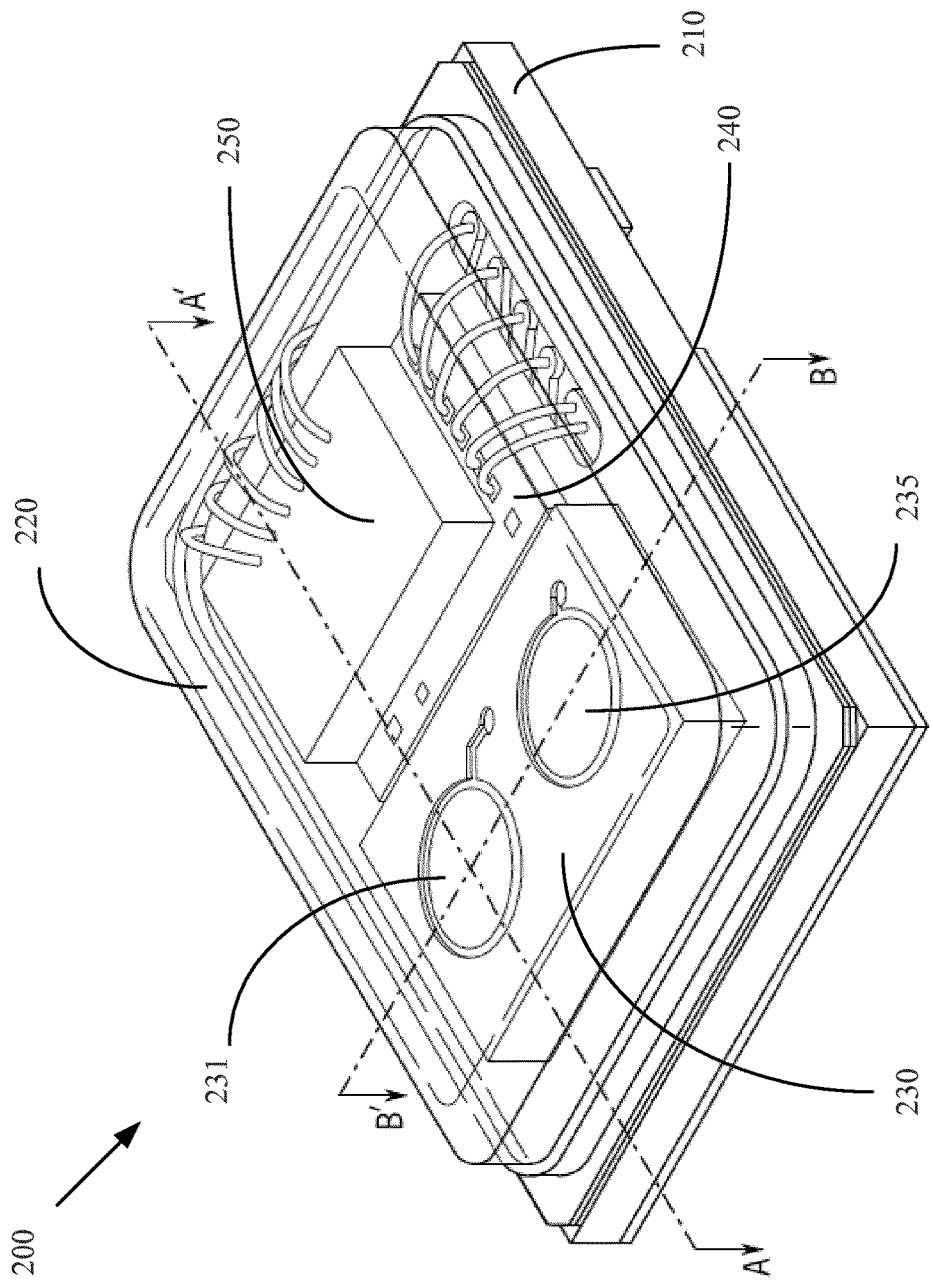
FIG. 2(A) is a schematic perspective diagram of a microphone device with an integrated pressure sensor according to a second embodiment.
Figure 2B:
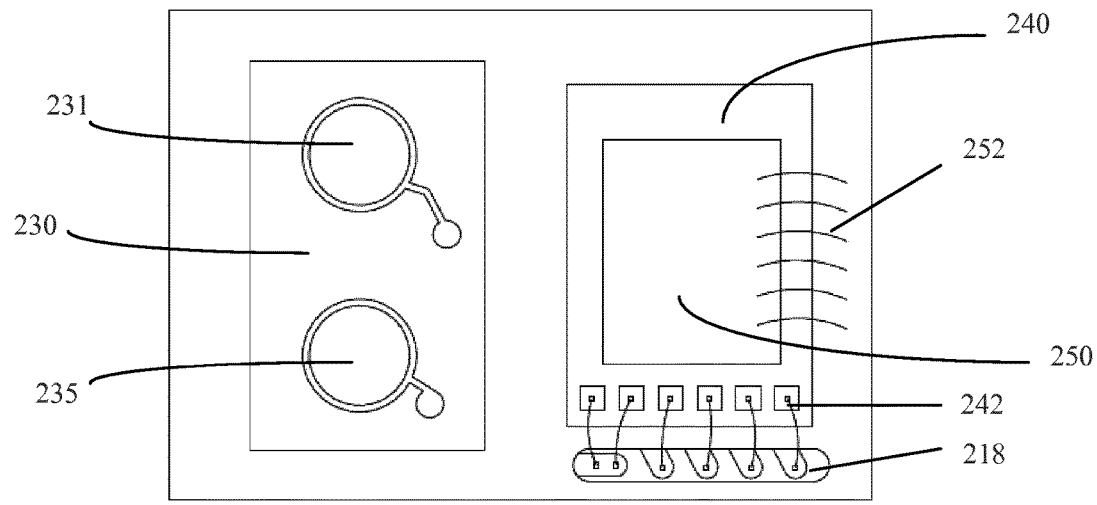
FIG. 2(B) is a top plan diagram of the microphone device of FIG. 2(A)
Figure 2C:
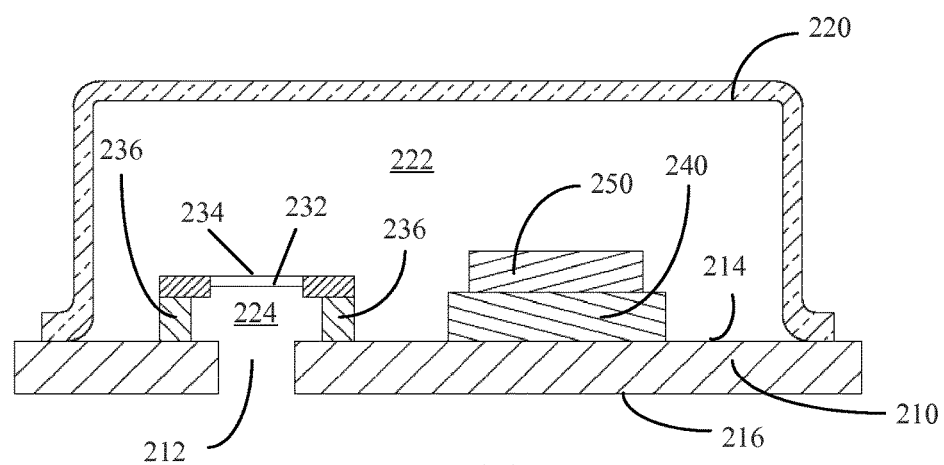
FIG. 2(C) is a cross-sectional diagram of the microphone device of FIG. 2(A), along the line A-A'.
Figure 2D:
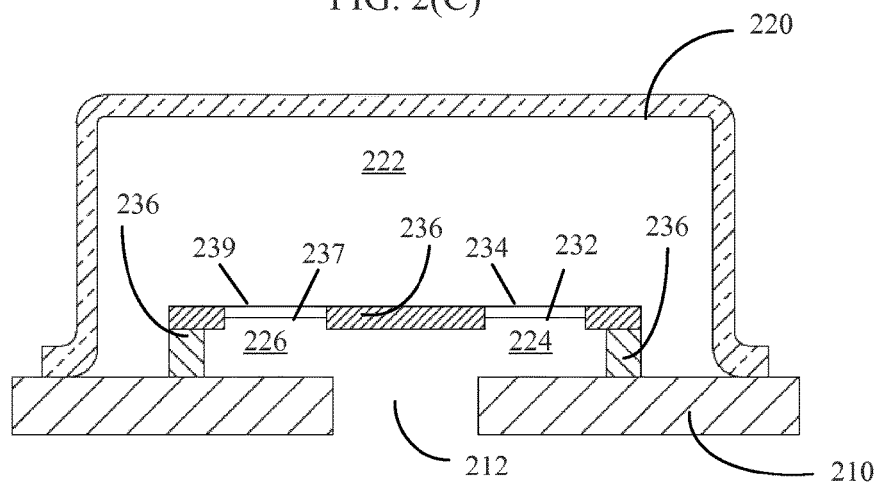
FIG. 2(D) is a cross-sectional diagram of the microphone device of FIG. 2(A), along the line B-B'.

Referring to FIGS. 2(A) through 2(D), a microphone device with an integrated pressure sensor is shown according to a second embodiment. FIG. 2(A) shows the schematic perspective diagram of the microphone device; FIG. 2(B) shows the top plan diagram of the microphone device; FIG. 2(C) shows a cross-sectional diagram of the microphone device along the line A-A'; and FIG. 2(D) shows a cross-sectional diagram of the microphone device along the line B-B'. The microphone device 200 includes a substrate (or base) 210, a cover (or lid) 220, a microphone die 230 including a first microphone motor 231 and a second microphone motor 235, an integrated circuit 240, and a pressure sensor provided on a sensor die 250. As used herein, a microphone motor refers to the diaphragm/backplate assembly. The cover 220 is attached to the substrate 210 and forms a housing interior 222 with the substrate 210. A port 212 is formed in the substrate 210, allowing sound and air flow to enter the housing interior 222. The microphone die 230 and the integrated circuit 240 are disposed within the housing interior 222 and attached to the substrate 210. The sensor die 250 comprising the pressure sensor is stacked on top of the integrated circuit 240.

The substrate 210, the port 212, and the cover 220 may have similar structure as the substrate 110, the port 112, and the cover 120 shown in FIG. 1, respectively.

The microphone die 230 is attached to the inner surface 214 of the substrate 210 and disposed on top of the port 212. The microphone die 230 includes the first microphone motor 231, the second microphone motor 235 disposed alongside the first microphone motor 231 along the direction B-B', and a supporting structure 236 supporting the first microphone motor 231 and the second microphone motor 235. The microphone motors 231 and 235 may be microelectromechanical systems (MEMS) microphones. The first microphone motor 231 includes a first diaphragm 232, and a first backplate 234 opposing the first diaphragm 232 and forming a capacitor with the first diaphragm 232. The second microphone motor 235 includes a second diaphragm 237, and a second backplate 239 opposing the second diaphragm 237 and forming a capacitor with the second diaphragm 237. The supporting structure 236 is formed of a semiconductor material (e.g., silicon) and attached to the inner surface 214 of the substrate 210 by, for example, adhesive. The first and second diaphragm 232 and 237 can each be a free-plate, constrained, or anchored diaphragm. A first front volume 224 is formed by the supporting structure 236 and the first diaphragm 232 for the first microphone motor 231. A second front volume 226 is formed by the supporting structure 236 and the second diaphragm 237 for the second microphone 235. The available space in the housing interior 222 forms the back volume for both microphone motors 231 and 235.

The arrangement of dual microphone motors can improve the signal-to-noise ratio (SNR) of the microphone device 200. In operations, voltages of opposite polarities may be applied to the first diaphragm 232 and the second diaphragm 237 (e.g., a positive voltage is applied to the first diaphragm 232 and a negative voltage is applied to the second diaphragm 237, or vice versa). In some embodiments, voltages of opposite polarities are applied to the first backplate 234 and the second backplate 239 (e.g., a positive voltage is applied to the first backplate 234 and a negative voltage is applied to the second backplate 239, or vice versa). A first signal is produced at the first microphone motor 231, which includes the intended sound signal received at the first diaphragm/backplate and noises, such as power supply noise, RF noise, etc. A second signal is produced at the second microphone motor 235 that includes the intended sound signal received at the second diaphragm/backplate and the noises. The intended sound signals are out of phase by 180 degrees with respect to each other, while the noises are common in the first and second signals. Thus, in a differential signal representing the difference between the first signal and the second signal, the noises are cancelled out while the intended sound signals are reinforced. In this way, the SNR can be improved for the microphone device 200. In another embodiment, the diaphragm/backplate of the second microphone motor 235 is flipped comparing to the diaphragm/backplate of the first microphone motor 231. In particular, 232 represents the first diaphragm, 234 represents the first backplate of the first microphone motor 231; 239 represents the second diaphragm, 237 represents the second backplate of the second microphone motor 235. In operations, voltages of the same polarity may be applied to the first diaphragm 232 and the second backplate 237 (or the first backplate 234 and the second diaphragm 239) in order to generate differential signals in the first and second microphone motors 231 and 235. It shall be understood that the differential configuration of dual motors is for illustration not for limiting; other arrangements of dual motors can be implemented to improve the SNR.

Air flow can leak through (and around) the microphone motors 231 and 235 and reach the pressure sensor carried by the sensor die 250 inside the housing interior 222. Through holes are made on the diaphragms to enable equalization of the static pressure on both sides of the diaphragms. In some embodiments, a plurality of perforations are formed on the backplates to enable ventilation or free circulation of air. In further embodiments, there is empty space between the diaphragms and the supporting structure 236 and/or in the supporting structure 236 for air to circulate between the front volumes 224, 226 and the housing interior 222.

The microphone die 230 further includes electrical connections (conductive traces, bond pads, etc.) for connecting the microphone motors 231 and 235 to a source and/or a ground and for transmitting electrical signals generated to the integrated circuit 240 for processing, as discussed above regarding electrical connections of the microphone die 130 shown in FIG. 1.

The integrated circuit 240 is attached to the inner surface 214 of the substrate 210 and disposed alongside the microphone die 230 along the direction A-A'. In some embodiments, the direction A-A' is different from the direction B-B'. In further embodiments, the direction A-A' is substantially perpendicular to the direction B-B'. The integrated circuit 240 may be an application specification integrated circuit (ASIC) fabricated on a die and attached to the inner surface 214 of the substrate 210 by, for example, adhesive. The integrated circuit 240 is configured to carry out operations such as amplification, filtering, differential processing, etc., to the electrical signals produced by the microphone motors 231, 235 and generate an output that can be used by, for example, an end-user device. The processing operations by the integrated circuit 240 can include analog and/or digital signal processing functions. In some embodiments, the electrical signals produced by the microphone motors 231, 235 are transmitted to the integrated circuit 240 through wire bonding. The output of the integrated circuit 240 can be transmitted through wire bonding between the bond pads 242 on the integrated circuit 240 and the conductive pads 218 on the inner surface 214 of the substrate 210, then through conductors (e.g., vias) in the substrate 210 and the connections areas on the outer surface 216 of the substrate 210, to the external device, as discussed above regarding electrical connections of the substrate 110 shown in FIG. 1. It shall be understood that this is for illustration and not for limiting; various approaches can be used to make electrical connections between the integrated circuit 240 and the external device for outputting the processed signals.

The sensor die 250 carrying the pressure sensor is stacked on top of the audio integrated circuit 240 within the housing interior 222. In some embodiments, the back side of the sensor die 250 is attached to the integrated circuit 240 using a low-stress adhesive (also referred to as low-modulus adhesive, e.g., Wacker 988) in order to reduce the sensitivity of the pressure sensor to the stresses of the substrate 210. The pressure sensor carried by the sensor die 250 can be similar to the pressure sensor carried by the WLCSP 150 shown in FIG. 1. The pressure sensor can be a MEMS pressure sensor. However, different from the WLCSP 150, the sensor die 250 is a bare die without being put in a package. In addition, the sensor die 250 die is electrically connected to the substrate 210 through wire bonding 252, not through solder balls in a flip chip configuration. The air flow can reach the pressure sensor inside the housing interior 222, thus enabling the sensing operation. In particular, the air flow coming from the ambience passes through the port 212 and the first and second front volumes 224, 226, leaks through (and around) the first and second microphone motors 231 and 235, and reaches the pressure sensor inside the housing interior 222. The port 212 defines both the acoustic access port for the two microphone motors 231, 235, and the access port for the pressure sensor carried by the sensor die 250.

The sensor die 250 further includes an integrated circuit for driving the pressure sensor and/or processing electrical signals produced by the pressure sensor. The integrated circuit carries out operations such as amplification, filtering, processing, etc., to the signals produced by the pressure sensor and generates an output that can be used by, for example, an end-user device. The processing operations by the integrated circuit can include analog and/or digital signal processing functions. The output of the integrated circuit can be transmitted through the wire bonding 250 to the substrate 210, and then to an external device. In some embodiments, the pressure sensor is calibrated after the sensor die 250 is integrated into the microphone device 200 in order to deliver an accurate reading. Different than the pre-calibrated pressure sensor carried by the WLCSP shown in FIG. 1, the pressure sensor carried by the sensor die 250 is calibrated after the components of the microphone device 200 are assembled because the process of assembling might introduce stress, which would affect the pressure sensor readings. During calibration, the readouts of the pressure sensor are compared to the accurate values, and the relationship between the measured and the accurate value is determined. In further embodiments, the calibration information is stored in a memory, for example, an OTP, that can be included in the sensor die 250. In some embodiments, the sensor die 250 further includes a temperature sensor and an integrated circuit for driving the temperature sensor and/or processing electrical signals produced by the temperature sensor.

In the microphone device with the integrated pressure sensor as show in FIGS. 2(A) through 2(D), dual motor arrangement is used to further improve the SNR. At the same time, the pressure sensor is in fluid communication with the ambient to achieve accurate pressure measurement. Further, by stacking the sensor die on top of the acoustic integrated circuit, the footprint can be reduced and the manufacturing process can be simplified.

Figure 2E:
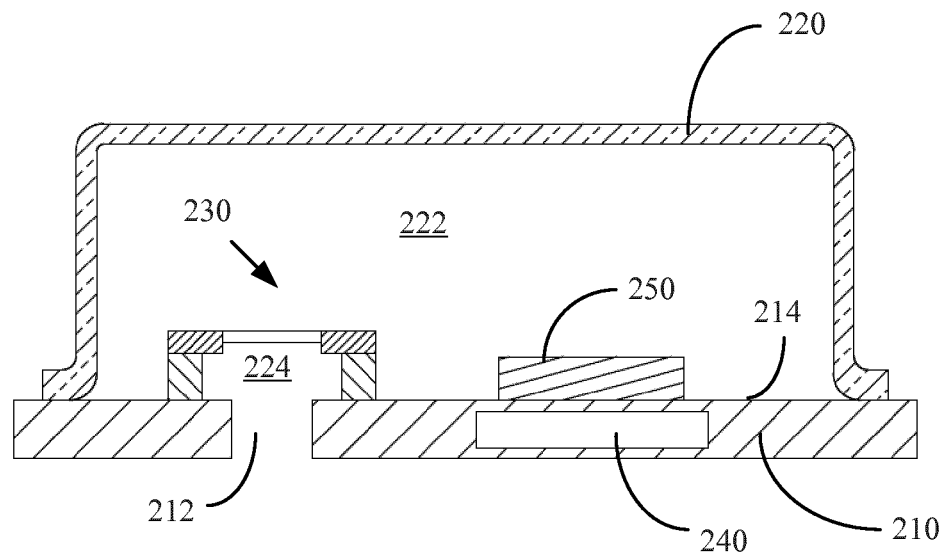
FIG. 2(E) is a cross-sectional diagram of a variation of the microphone device of FIG. 2(A), along the line B-B'.

Referring to FIG. 2(E), a variation of the microphone device depicted in FIGS. 2(A) through 2(D) is shown. The difference of the microphone device shown in FIG. 2(E) from the device shown in FIGS. 2(A) through 2(D) is that the integrated circuit 240 is embedded in the substrate 210 and that the back side of the sensor die 250 is attached directly to the substrate 210. A low-stress adhesive (also referred to as low-modulus adhesive, e.g., Wacker 988) may be used to fasten the sensor die 250 to the substrate 210 in order to reduce the sensitivity of the pressure sensor to the stresses of the substrate 210. In some embodiments, the integrated circuit 240 is embedded into the substrate 210 by the process of laminating. In further embodiments, μ-vias are formed in the substrate 210 extending from the integrated circuit 240 to the conductive pads on the inner surface 214 of the substrate 210 electrically connecting the integrated circuit 240 to the microphone die 230 and the external device. Back volume can increase due to the arrangement of embedded integrated circuit, thus improving the acoustic performance (e.g., SNR) of the microphone device 200. Furthermore, larger dies can be accommodated for a given package size due to the increased back volume.

Figure 2F:
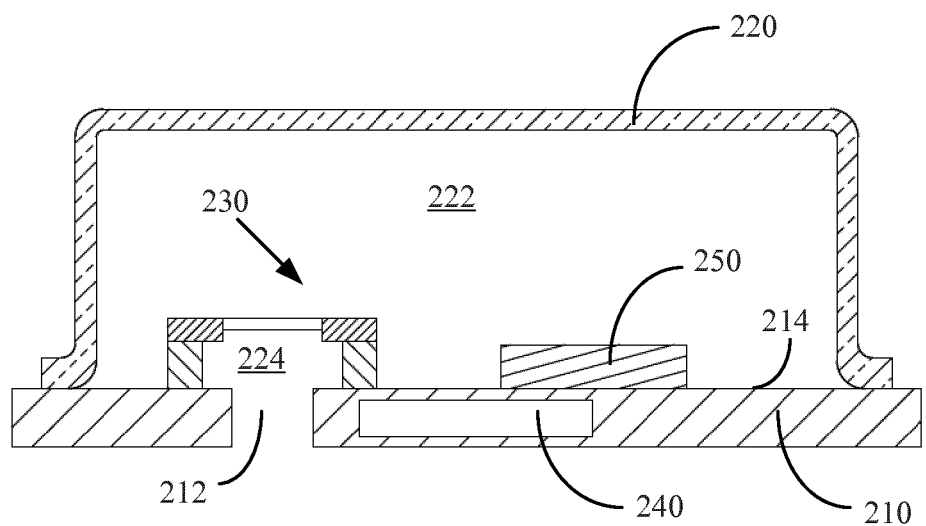
FIG. 2(F) is a cross-sectional diagram of another variation of the microphone device of FIG. 2(A), along the line B-B'.

Referring to FIG. 2(F), another variation of the microphone device depicted in FIGS. 2(A) through 2(D) is shown. Like the microphone device shown in FIG. 2(E), the integrated circuit 240 is embedded in the substrate 210 and the back side of the sensor die 250 is attached directly to the substrate 210. But the microphone die 230 is disposed at least partially over the integrated circuit 240. This arrangement can fit a dual MEMS microphone with an integrated pressure sensor in a smaller package.

Figure 3A:
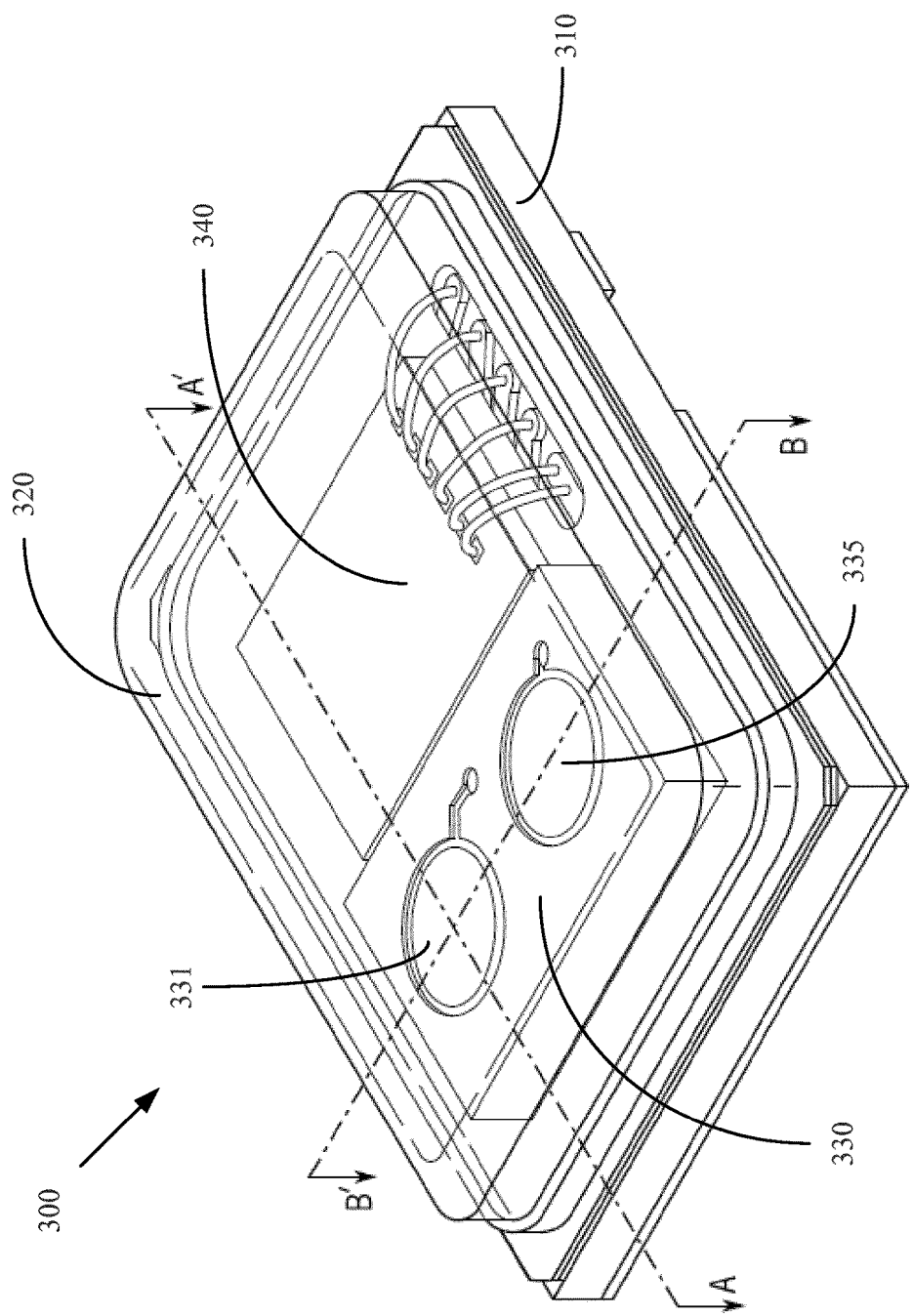
FIG. 3(A) is a schematic perspective diagram of a microphone device with an integrated pressure sensor according to a third embodiment.
Figure 3B:
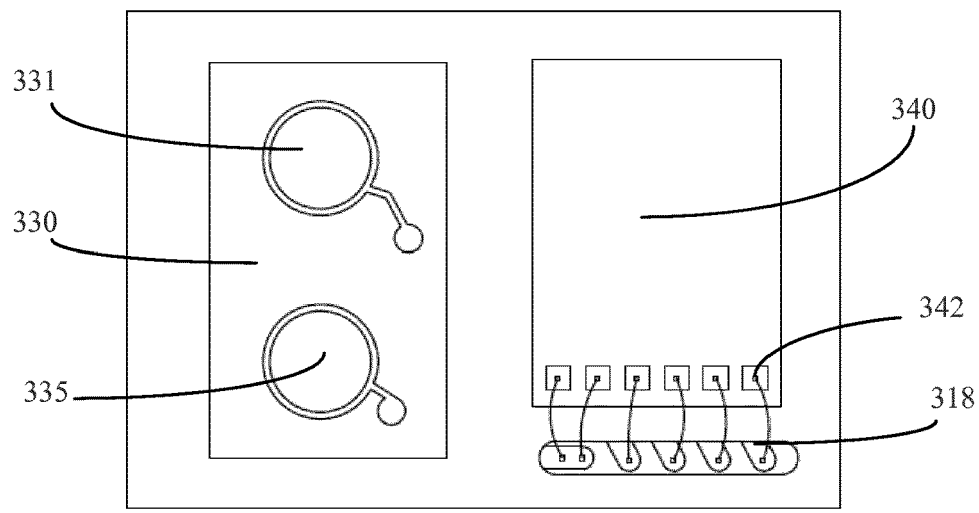
FIG. 3(B) is a top plan diagram of the microphone device of FIG. 3(A)
Figure 3C:
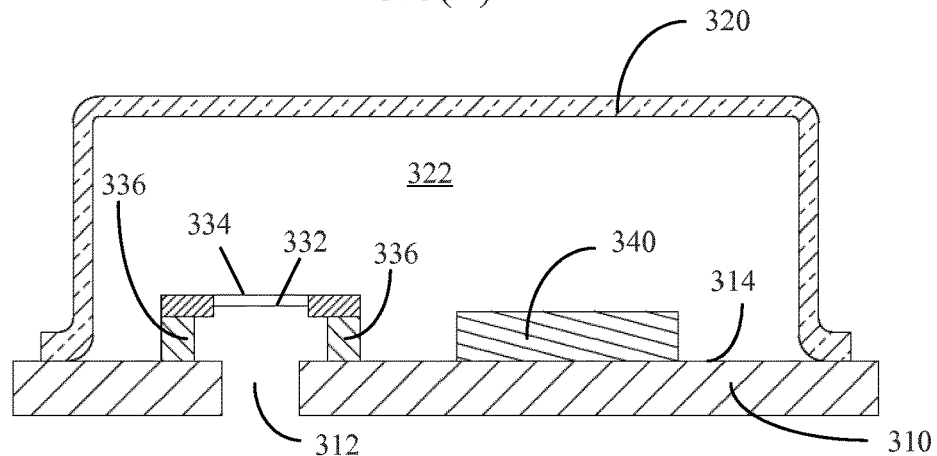
FIG. 3(C) is a cross-sectional diagram of the microphone device of FIG. 3(A), along the line A-A'.
Figure 3D:
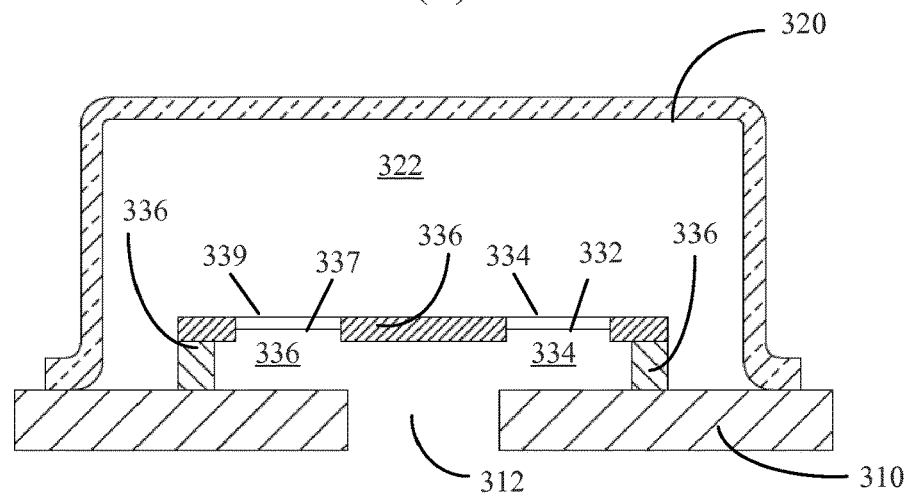
FIG. 3(D) is a cross-sectional diagram of the microphone device of FIG. 3(A), along the line B-B'.

Referring to FIGS. 3(A) through 3(D), a microphone device with an integrated pressure sensor is shown according to a third embodiment. FIG. 3(A) shows the schematic perspective diagram of the microphone device; FIG. 3(B) shows the top plan diagram of the microphone device; FIG. 3(C) shows a cross-sectional diagram of the microphone device along the line A-A'; and FIG. 3(D) shows a cross-sectional diagram of the microphone device along the line B-B'. The microphone device 300 includes a substrate (or base) 310, a cover (or lid) 320, a microphone die 330 including a first microphone motor 331 and a second microphone motor 335, and an integrated circuit die 340 carrying a pressure sensor. The cover 320 is attached to the substrate 310 and forms a housing interior 322 with the substrate 310. A port 312 is formed in the substrate 310, allowing sound and air flow to enter the housing interior 322. The microphone die 330 and the integrated circuit die 340 are disposed within the housing interior 322 and attached to the substrate 310.

The substrate 310, the port 312, and the cover 320 may have similar structure as the substrate 110, the port 112, and the cover 120 shown in FIG. 1, respectively. The microphone die 330 is attached to the inner surface 314 of the substrate 310 and disposed on top of the port 312. The microphone die 330 may have similar structure as the microphone die 230 shown in FIG. 2), including the first microphone motor 331, the second microphone motor 335 disposed alongside the first microphone motor 231 along the direction B-B', and a supporting structure 336 supporting the first microphone motor 331 and the second microphone motor 335. The microphone motors 331 and 335 may be microelectro-mechanical systems (MEMS) microphones. The first microphone motor 331 includes a first diaphragm 332, and a first backplate 334 opposing the first diaphragm 332. The second microphone motor 335 includes a second diaphragm 337, and a second backplate 339 opposing the second diaphragm. The supporting structure 336 is formed of a semiconductor material (e.g., silicon) and attached to the inner surface 314 of the substrate 310 by, for example, adhesive. A first front volume 324 is formed by the supporting structure 336 and the first diaphragm 332 for the first microphone motor 331. A second front volume 326 is formed by the supporting structure 336 and the second diaphragm 337 for the second microphone 335. The available space in the housing interior 322 forms the back volume for both microphone motors 331 and 335. The microphone motors 331 and 335 may be arranged in the differential configuration or other configurations in order to improve the SNR of the microphone device 300. In some embodiments, the diaphragm and backplate of the second microphone motor 335 are flipped comparing to the diaphragm and backplate of the first microphone motor 331. Air flow can leak through (and around) the microphone motors 331 and 335 and reach the pressure sensor carried by the integrated circuit die 340 inside the housing interior 322. The microphone die 330 further includes electrical connections (conductive traces, bond pads, etc.) for connecting the microphone motors 331 and 335 to a source and/or a ground and for transmitting electrical signals generated to the integrated circuit die 340 for processing, as discussed above regarding electrical connections of the microphone die 130 shown in FIG. 1.

The integrated circuit die 340 is attached to the inner surface 314 of the substrate 310 and disposed alongside the microphone die 330 along the direction A-A'. In some embodiments, the direction A-A' is different from the direction B-B'. In further embodiments, the direction A-A' is substantially perpendicular to the direction B-B'. The integrated circuit die 340 may be an application specification integrated circuit (ASIC) fabricated on a die and attached to the inner surface 314 of the substrate 310 by, for example, adhesive. The integrated circuit die 340 can include the acoustic integrated circuit for processing signals produced by the microphone motors 331, 335, the pressure sensor for sensing the atmospheric pressure in the vicinity of the device 300, and the pressure integrated circuit for processing signals by the pressure sensor. In some embodiments, the electrical signals produced by the microphone motors 331, 335 are transmitted to the integrated circuit die 340 through wire bonding. The output of the integrated circuit die 340 can be transmitted through wire bonding between the bond pads 342 on the integrated circuit die 340 and the conductive pads 318 on the inner surface 314 of the substrate 310, then through conductors (e.g., vias) in the substrate 310 and the connections areas on the outer surface 316 of the substrate 310, to the external device, as discussed above regarding electrical connections of the substrate 110 shown in FIG. 1. It shall be understood that this is for illustration and not for limiting; various approaches can be used to make electrical connections between the integrated circuit die 340 and the external device for outputting the processed signals.

The air flow can reach the pressure sensor inside the housing interior 322, thus enabling the sensing operation. In particular, the air flow coming from the ambience passes through the port 312 and the first and second front volumes 324, 326, leaks through (and around) the first and second microphone motors 331 and 335, and reaches the pressure sensor inside the housing interior 322. The port 312 defines both the acoustic access port for the two microphone motors 331, 335, and the access port for the pressure sensor carried by the integrated circuit die 340.

In some embodiments, the pressure sensor is calibrated after the integrated circuit die 340 is integrated into the microphone device 300 in order to deliver an accurate reading. The pressure sensor is calibrated after the components of the microphone device 300 are assembled because the process of assembling might introduce stress which would affect the pressure sensor readings. During calibration, the readouts of the pressure sensor are compared to the accurate values, and the relationship between the measured and the accurate value is determined. In further embodiments, the calibration information is stored in a memory, for example, an OTP, that can be included in the integrated circuit die 340. In some embodiments, the integrated circuit die 340 further includes a temperature sensor and an integrated circuit for driving the temperature sensor and/or processing electrical signals produced by the temperature sensor. In some embodiment, the electrical circuits of the integrated circuit die 340 are optimized to minimize the cross-talk between the readouts of the microphone and the pressure sensor.

In the microphone device with the integrated pressure sensor as show in FIGS. 3(A) through 3(D), dual motor arrangement is used to further improve the SNR. At the same time, the pressure sensor is in fluid communication with the ambient to achieve accurate pressure measurement. Further, by integrating the pressure sensor with the acoustic integrated circuit on the same die, the footprint can be reduced and the manufacturing process can be simplified.

Figure 4A:
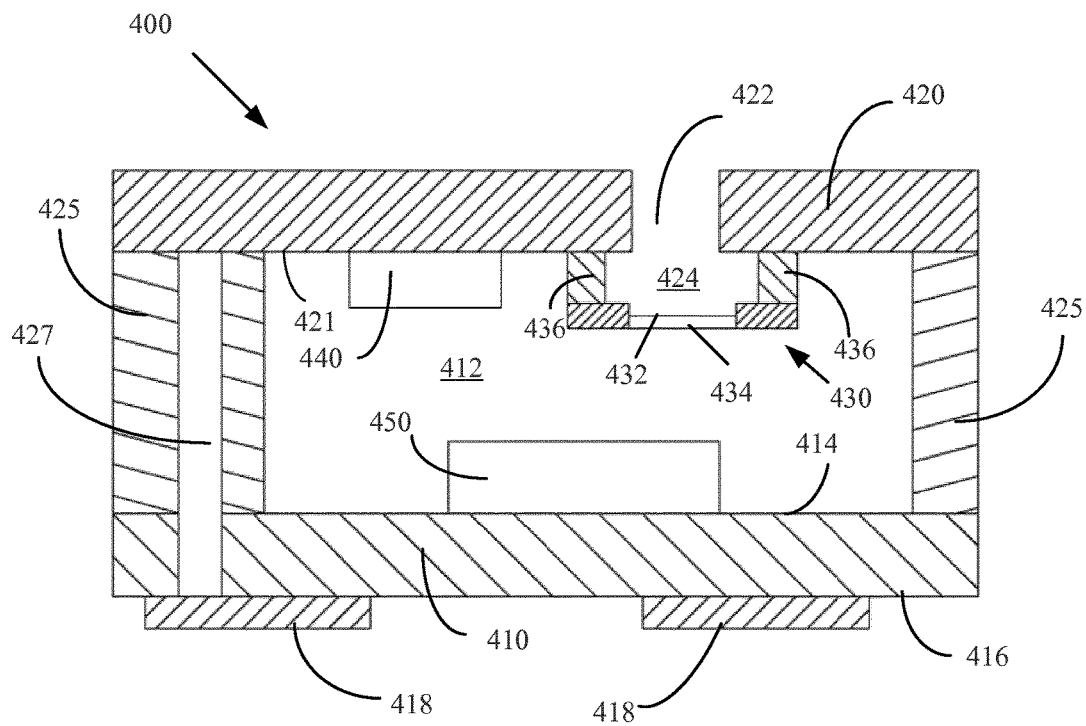
FIG. 4(A) is a cross-sectional diagram of a microphone device with an integrated pressure sensor according to a fourth embodiment.

Referring to FIG. 4(A), a microphone device with an integrated pressure sensor is shown according to a fourth embodiment. The microphone device 400 is a MEMS-on-lid configuration, including a substrate (or base) 410, a cover (or lid) 420, walls 425, a microphone die 430, an integrated circuit 440, and a sensor die 450. Walls 425 are attached to the substrate 410 and the cover 420, forming a housing interior 412 with the substrate 410 and the cover 420. A port 422 is formed in the cover 420, allowing sound and air flow to enter the housing interior 412. The microphone die 430 is attached to the cover 420 and suspended over the port 422. The integrated circuit 440 is attached to the cover 420. The sensor die 450 is attached to the substrate 410.

The substrate 410, the cover 420, and the walls 425 may be made of PCB material (e.g., constructed of FR-4 material), and collectively provide electrical paths connecting the components inside the housing interior 412 to components/devices outside of the housing. In particular, an inner surface 414 of the substrate 410 and an inner surface 421 of the cover 420 may include etched portions of conductive material to define lead pads, bond pads, ground pads, etc., that can be electrically connected to the microphone die 430, the integrated circuit 440, and the sensor die 450 through wire bonding, flip chip bonding, and so on. These conductive pads are electrically connected to one or more conductive vias 427 extending through the wall 425 and the substrate 410. The via 427 is a hole drilled through the wall 425 and the substrates 410 and filled or plated with a conductive material. The via 427 is electrically connected to connection areas 418 formed on an outer surface 416 of the substrate 410. The connections areas may be customer pads for electrical connection to an external board of an end-user device. It shall be understood that the electrical paths illustrated herein are for illustration not for limiting, various electrical paths can be formed with the substrate 410, the cover 420, and the wall 425.

The port 422 is formed in the lid 420 for receiving acoustic waves and air flow. The port 422 can be in the shape of circle, oval, rectangle, etc. In some embodiments, a mesh covers the port 422 for preventing water, particles, and/or light from entering the housing interior 412.

The microphone die 430 is attached to the inner surface 421 of the cover 420 and suspended over the port 422. The microphone die 430 may be a MEMS microphone, including a diaphragm 432, a backplate 434 opposing the diaphragm 432, and a supporting structure 436 supporting the diaphragm 132 and the backplate 134. The supporting structure 136 is formed of a semiconductor material (e.g., silicon) and attached to the inner surface 421 of the cover 420 by, for example, adhesive. The available space in the housing interior 412 forms the back volume for the microphone. Air flow can leak through (and around) the diaphragm 432 and the backplate 434 and reach the pressure sensor die 450 inside the housing interior 412. The microphone die 430 further includes electrical connections (e.g., conductive traces and bond pads) for connecting the microphone die 430 to a source and/or a ground and for transmitting electrical signals produced to the integrated circuit 440 for processing.

The integrated circuit 440 is attached to the inner surface 421 of the cover 420 and disposed alongside the microphone die 430. The integrated circuit 440 may be an application specification integrated circuit (ASIC) fabricated on a die and attached to the inner surface 421 of the cover 420 by, for example, adhesive. The integrated circuit 440 is configured to carry out operations such as amplification, filtering, processing, etc., to the electrical signals produced by the microphone die 430 and generate an output that can be used by, for example, an end-user device. The processing operations by the integrated circuit 440 can include analog and/or digital signal processing functions. In some embodiments, the electrical signals produced by the microphone die 430 are transmitted to the integrated circuit 440 through wire bonding. The output of the integrated circuit 440 can be transmitted through wire bonding between the integrated circuit 440 and the conductive pads on the inner surface 421 of the cover 420, then through the conductive vias extending through the wall 425 and the substrate 410 and the connections areas 418 on the outer surface 416 of the substrate 410, to the external device. It shall be understood that this is for illustration and not for limiting; various approaches can be used to make electrical connections between the integrated circuit 140 and the external device for outputting the processed signals.

The sensor die 450 carrying the pressure sensor is attached to the inner surface 414 of the substrate 410 using, for example a low-stress adhesive (also referred to as low-modulus adhesive, e.g., Wacker 988). The sensor die 450 may be similar to the sensor die 250 shown in FIG. 2. In some embodiments, the pressure sensor carried by the sensor die 450 is a MEMS pressure sensor. The sensor die 450 die may be electrically connected to the substrate 410 through wire bonding. The air flow can reach the pressure sensor inside the housing interior 412, thus enabling the sensing operation. The port 422 defines both the acoustic access port for the microphone die 430, and the access port for the pressure sensor carried by the sensor die 450.

The sensor die 450 further includes an integrated circuit for driving the pressure sensor and/or processing electrical signals produced by the pressure sensor. The integrated circuit carries out operations such as amplification, filtering, processing, etc., to the signals produced by the pressure sensor and generates an output that can be used by, for example, an end-user device. The processing operations by the integrated circuit can include analog and/or digital signal processing functions. The output of the integrated circuit can be transmitted through wire bonding to the substrate 410, and then to an external device. In some embodiments, the pressure sensor is calibrated after the sensor die 450 is integrated into the microphone device 400 in order to deliver an accurate reading. The pressure sensor carried by the sensor die 450 is calibrated after the components of the microphone device 400 are assembled because the process of assembling might introduce stress, which would affect the pressure sensor readings. During calibration, the readouts of the pressure sensor are compared to the accurate values, and the relationship between the measured and the accurate value is determined. In further embodiments, the calibration information is stored in a memory, for example, an OTP, that can be included in the sensor die 450. In some embodiments, the sensor die 450 further includes a temperature sensor and an integrated circuit for driving the temperature sensor and/or processing electrical signals produced by the temperature sensor.

Figure 4B:
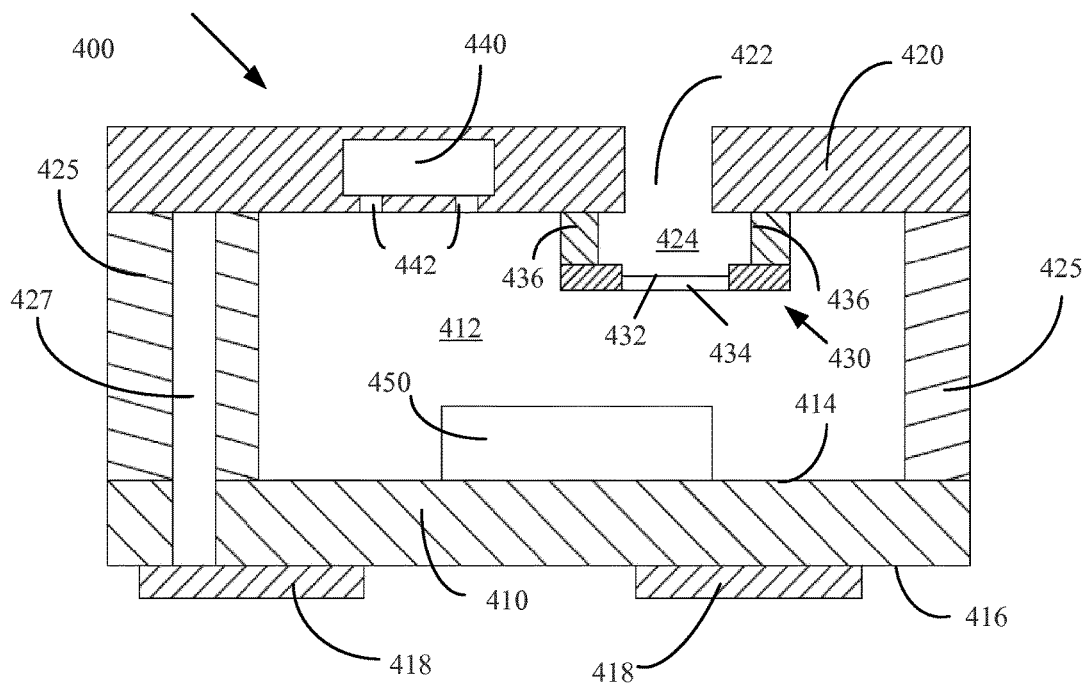
FIG. 4(B) is a cross-sectional diagram of a variation of the microphone device of FIG. 4(A).

Referring to FIG. 4(B), a variation of the microphone device depicted in FIG. 4(A) is shown. The difference of the microphone device shown in FIG. 4(B) from the device shown in FIG. 4(A) is that the integrated circuit 440 is embedded in the cover 420. In some embodiments, the integrated circuit 440 is embedded into the cover 420 by the process of laminating. In further embodiments, μ-vias 422 are formed in the cover 420 extending from the integrated circuit 440 to the contact pads on the inner surface 421 of the cover 420, electrically connecting the integrated circuit 440 to the microphone die 430 and the external device. Back volume can increase due to the arrangement of embedded integrated circuit, thus improving the acoustic performance (e.g., SNR) of the microphone device 400. Furthermore, larger dies can be accommodated for a given package size due to the increased back volume.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably coupleable," to each other to achieve the desired functionality. Specific examples of operably coupleable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone device comprising:
   a substrate;
   a port formed in the substrate;
   a cover attached to the substrate that forms a housing interior with the substrate;
   a microphone die disposed in the housing interior and on top of the port, wherein the microphone die includes a first microphone motor and a second microphone motor, wherein the first microphone motor includes a first diaphragm and a first backplate opposing the first diaphragm, and wherein the second microphone motor includes a second diaphragm and a second backplate opposing the second diaphragm;
   an acoustic integrated circuit structured to process signals produced by the first microphone motor and the second microphone motor; and
   a sensor die disposed in the housing interior and stacked on top of the acoustic integrated circuit, wherein the sensor die comprises a pressure sensor and a one-time programmable memory, wherein the pressure sensor carried by the sensor die is calibrated after the sensor die is integrated into the microphone device and calibration information of the pressure sensor is stored in the one-time programmable memory.

2. The microphone device of claim 1, wherein the acoustic integrated circuit is disposed in the housing interior and attached to the substrate.

3. The microphone device of claim 2, wherein a back surface of the sensor die is attached to the acoustic integrated circuit through a low-pressure adhesive.

4. The microphone device of claim 1, wherein the acoustic integrated circuit is embedded in the substrate.

5. The microphone device of claim 4, wherein the microphone die is disposed at least partially over the acoustic integrated circuit.

6. The microphone device of claim 1, wherein the second microphone motor is disposed alongside the first microphone motor, and wherein the first microphone motor and the second microphone motor are in a differential output configuration.

7. The microphone device of claim 6, wherein voltages of opposite polarities are applied to the first diaphragm and the second diaphragm.

8. The microphone device of claim 6, wherein the second diaphragm and the second backplate are flipped compared to the first diaphragm and the first backplate.

9. The microphone device of claim 8, wherein the acoustic integrated circuit is an application specific integrated circuit (ASIC) die.

10. The microphone device of claim 1, wherein the first microphone motor and the second microphone motor are microelectro mechanical system (MEMS) microphones, and wherein the pressure sensor is a MEMS pressure sensor.

11. The microphone device of claim 1, wherein the sensor die further comprises a temperature sensor.

12. A microphone device comprising:
a substrate;
a port formed in the substrate;
a cover attached to the substrate that forms a housing interior with the substrate;
a microphone die disposed in the housing interior and on top of the port, wherein the microphone die includes a first microphone motor and a second microphone motor, wherein the first microphone motor includes a first diaphragm and a first backplate opposing the first diaphragm, and wherein the second microphone motor includes a second diaphragm and a second backplate opposing the second diaphragm; and
an integrated circuit die disposed in the housing interior and attached to the substrate, wherein the integrated circuit die comprises an acoustic integrated circuit structured to process signals produced by the first microphone motor and the second microphone motor, a pressure sensor, and a pressure integrated circuit structured to process signals produced by the pressure sensor, wherein the pressure sensor is calibrated after the integrated circuit die is integrated into the microphone device and calibration information of the pressure sensor is stored in a one-time programmable memory included in the integrated circuit die.

13. The microphone device of claim 12, wherein the second microphone motor is disposed alongside the first microphone motor, and wherein the first microphone motor and the second microphone motor are in a differential output configuration.

14. The microphone of claim 13, wherein voltages of opposite polarities are applied to the first diaphragm and the second diaphragm.

15. The microphone of claim 13, wherein the second diaphragm and the second backplate are flipped compared to the first diaphragm and the first backplate.

16. The microphone device of claim 12, wherein the integrated circuit die further comprises a temperature sensor.

* * * * *